(12) United States Patent
Kenney

(10) Patent No.: US 8,509,371 B2
(45) Date of Patent: Aug. 13, 2013

(54) CONTINUOUS-RATE CLOCK RECOVERY CIRCUIT

(75) Inventor: John G. Kenney, Princeton Junction, NJ (US)

(73) Assignee: Analog Devices, Inc., Norwood, MA (US)

( * ) Notice: Subject to any disclaimer, the term of this patent is extended or adjusted under 35 U.S.C. 154(b) by 888 days.

(21) Appl. No.: 12/569,381

(22) Filed: Sep. 29, 2009

(65) Prior Publication Data

US 2011/0075781 A1 Mar. 31, 2011

(51) Int. Cl.
*H04L 7/00* (2006.01)
(52) U.S. Cl.
USPC ........... 375/376; 375/316; 375/354; 375/355; 375/356; 375/357; 375/371; 375/373; 375/374; 375/375
(58) Field of Classification Search
USPC ................. 375/316, 376, 354, 355, 356, 357, 375/371, 373, 374, 375
See application file for complete search history.

(56) References Cited

U.S. PATENT DOCUMENTS

| | | | | |
|---|---|---|---|---|
| 4,862,485 | A * | 8/1989 | Guinea et al. ................. | 375/376 |
| 6,670,853 | B2 * | 12/2003 | Kim et al. ...................... | 331/1 A |
| 7,285,994 | B2 | 10/2007 | Dalton et al. | |
| 2002/0061087 | A1 * | 5/2002 | Williams ........................ | 375/376 |
| 2002/0075980 | A1 * | 6/2002 | Tang et al. .................... | 375/372 |
| 2003/0094982 | A1 | 5/2003 | Zampetti et al. | |
| 2004/0202271 | A1 * | 10/2004 | Fahim ........................... | 375/376 |
| 2005/0220181 | A1 * | 10/2005 | Rasmussen ................... | 375/226 |
| 2006/0170470 | A1 | 8/2006 | Wang | |
| 2007/0127600 | A1 * | 6/2007 | Sato et al. ..................... | 375/327 |
| 2008/0112526 | A1 * | 5/2008 | Yi .................................. | 375/376 |
| 2010/0017763 | A1 * | 1/2010 | Kim et al. ......................... | 716/4 |
| 2010/0027586 | A1 * | 2/2010 | Ogasawara et al. ........... | 375/130 |
| 2010/0277211 | A1 * | 11/2010 | Geng et al. ..................... | 327/158 |
| 2010/0301961 | A1 * | 12/2010 | Story et al. .................... | 332/149 |

OTHER PUBLICATIONS

Search Report and Written Opinion in PCT/US2010/050508, dated Mar. 11, 2011.
PCT Demand in PCT/US2010/050508, dated Jul. 28, 2011.
Written Opinion of the International Preliminary Examining Authority in PCT/US2010/050508, dated Aug. 26, 2011.
Response to Written Opinion in PCT/US2010/050508, dated Oct. 25, 2011.
International Preliminary Report on Patentability in PCT/US2010/050508, dated Nov. 23, 2011.
International Search Report and Written Opinion dated Mar. 11, 2011, received in International Application No. PCT/US2010/050508.
ADN2812 Data Sheet: Analog Devices; Continuous Rate 12.3 Mb/s to 2.7 Gb/s Clock and Data Recovery IC with Integrated Limiting Amp; 28 pages (Mar. 2009); available at World Wide Web page: analog.com/en/clock-and-timing/clock-and-data-recoveryretiming/adn2812/products/product.html.

(Continued)

*Primary Examiner* — Siu Lee
(74) *Attorney, Agent, or Firm* — Knobbe Martens Olson & Bear LLP

(57) ABSTRACT

A continuous-rate clock and data recovery circuit includes a delay locked loop with a first integrator and a phase locked loop with a separate integrator. The delay locked loop and the phase locked loop are in a dual loop architecture. The first integrator is a digital accumulator that wraps upon exceeding a maximum or minimum value. The second integrator is a digital accumulator that saturates at its maximum or minimum value.

24 Claims, 17 Drawing Sheets

(56) References Cited

OTHER PUBLICATIONS

ADN2812 Product Listing: Continuous Rate 12.3 Mb/s to 2.7 Gb/s Clock and Data Recovery IC with Integrated Limiting Amp; 2 pages (Mar. 2009); available at World Wide Web page: analog.com/en/clock-and-timing/clock-and-data-recoveryretiming/adn2812/products/product.html.

Dalton et al., "A 12.5-Mb/s to 2.7-Gb/s Continuous-Rate CDR with Automatic Frequency Acquisition and Data-Rate Readback", *IEEE Journal of Solid-State Circuits*, vol. 40, No. 12; pp. 2713-2725; (Dec. 2005).

Savoj et al., "A 10-Gb/s CMOS Clock and Data Recovery Circuit With a Half-Rate Binary Phase/Frequency Detector", *IEEE Journal of Solid-State Circuits*, vol. 38, No. 1; pp. 13-21; (Jan. 2003).

Written Opinion of the International Preliminary Examining Authority received in International Application No. PCT/US2010/050508., dated Aug. 26, 2011.

Annex to form PCT/ISA/206 Communication Relating to the Results of the Partial International Search, received in International Application No. PCT/US2010/050508. Mailed Dec. 28, 2010.

* cited by examiner

CONTINUOUS-RATE CLOCK RECOVERY CIRCUIT

FIELD OF THE INVENTION

Systems, apparatuses, and methods consistent with the present invention relate to generating a clock signal, and more particularly to a clock recovery circuit for generating a continuous-rate clock signal.

BACKGROUND OF THE INVENTION

A data signal is sometimes transmitted without a clock signal (e.g., a non-return to zero (NRZ) signal). NRZ signals are advantageous in that they require only half the bandwidth necessary to transmit both a data signal and a clock signal. However, a clock signal is still useful to sample the data signal and recover the data.

One way to sample the data signal is to use a recovered clock signal. A clock signal may be recovered by generating a reference clock signal, and then phase-aligning and frequency-aligning the generated clock signal to the data signal. This is often referred to as clock and data recovery (CDR). A continuous-rate CDR is a CDR that can operate over a wide range of data rates.

A phase-locked loop (PLL) clock recovery system may be used to recover a clock signal. Generally, a PLL detects the phase difference and frequency difference between the received NRZ and a reference clock signal, and modulates the source of the reference signal (e.g., a voltage controlled oscillator (VCO)) to bring it into the same phase and frequency as the NRZ. An example of a PLL-implemented CDR system is found in an article entitled, "A Self Correcting Clock Recovery Circuit", *Journal of Lightwave Technology*, Vol. LT-3, No. 6, December 1985, by Charles R. Hogge, Jr., which is incorporated by reference in its entirety.

A delay-locked loop (DLL) clock recovery system may also be used to recover a clock signal. One difference between a DLL and a PLL is that the DLL does not adjust a VCO. Instead, the DLL compares the phase of an output to the phase of an input to generate an error signal, which is fed back to control delay elements in the DLL. The error signal goes, essentially, to zero, when the tunable delay aligns the phase of the output of the DLL to the phase of the input.

PLLs and DLLs may be combined into a dual loop D/PLL architecture. An example of an analog implementation of a D/PLL CDR system is found in U.S. Pat. No. 5,036,298, "Clock Recovery Circuit with Jitter Peaking," assigned to Analog Devices, Inc., which is incorporated by reference in its entirety. Among other advantages, D/PLL systems permit separate jitter-tolerance (JTOL) and jitter-transfer (JTRAN) bandwidths, each optimized for manufacturing robustness. JTOL is a measure of the ability of a PLL to operate properly (i.e., remain in lock in the presence of jitter of various magnitudes at different frequencies) when jitter is applied to the source data signal. JTRAN bandwidth is measure of the magnitude of the jitter at an output of a device with respect to the magnitude of jitter at an input.

Decoupling JTRAN from JTOL leads to a signal conditioner (i.e., a device that converts one type of electronic signal into a another type of signal) in which there can be substantially less jitter at the output of the signal conditioner relative to the input. This eases the jitter tolerance requirements of subsequent clock and data recovery (CDR) circuits in a host system, e.g., 1 UIpp of jitter at 8 MHz on the input is attenuated to 0.15 UIpp at the output for a D/PLL with a jitter transfer bandwidth of 1.2 MHz.

FIG. 1 illustrates an analog D/PLL that is part of a prior art continuous-rate CDR system. The CDR system in FIG. 1 aligns both frequency and phase, however, only phase alignment is relevant to this disclosure. The prior art D/PLL includes a PLL 1 and a DLL 2. The PLL 1 includes the Phase Detector 8, the Analog Charge Pump 9, the Phase Capacitor ($C_P$) 10, the VCO 11 and the Divider 12. The VCO 11 includes a fine tune voltage control $K_{VCO}$ and a coarse tune voltage control $O_c K_{VCO}$, which are known to those of ordinary skill in the art. The DLL 2 includes the Phase Shifter 7, the Phase Detector 8, the Analog Charge Pump 9, and the $C_P$ 10.

The output of the Phase Shifter 7 is input to the Phase Detector 8, which can be either linear or binary. High-frequency JTOL has, for example, a 3 dB bandwidth for a linear phase detector, and is slew rate limited on phase for a binary phase detector. Decoupled JTRAN and JTOL bandwidths are maintained regardless of whether the phase detector is linear or binary. Moreover, the JTRAN is identical for either a linear or binary phase detector, which is not the case for a single-loop PLL.

Up/down information from the Phase Detector 8 is applied to the charge pump PhCP 13. Ideally, an analog charge pump is a perfect integrator with a pole at DC. However, circuit imperfections such as leakage currents and finite output device impedances make the charge pump a leaky integrator. Leaky integrators lead to steady state errors at the output of the Phase Detector 8. Steady state errors in CDRs result in static phase offset, where the sampling is no longer in the middle of the data eye. Another source of static phase offset in linear phase detectors is mismatch between pump up and pump down currents in the charge pump PhCP 9. This mismatch is not problematic in a binary phase detector. Leaky integrators may also cause the D/PLL to lose frequency lock in the presence of a long sequence of consecutive identical digits.

The charge pump PhCP 9 and capacitor $C_p$ 10 voltage controls the group delay of the Phase Shifter 7. This same charge pump voltage is also applied to a varactor port with gain $K_{VCO}$ on the VCO 11. The varactor port with gain $K_{VCO}$ is part of the PLL 1. The Divider 12 is typically a power of 2 (i.e., $2^N$), whose value is determined during rate acquisition according to methods known to those of ordinary skill in the art.

Because the charge pump PhCP 9 and capacitor $C_p$ 10 are shared by the PLL 1 and DLL 2, careful circuit design is taken to guarantee that the gain of the PLL 1 goes to 0 before the gain of the DLL 2 goes to 0. Otherwise, the system risks going unstable.

The VCO 11 has multiple tunable parameters not illustrated in FIG. 1. Only the parameters that are manipulated by the loop filter are shown in FIG. 1. Two VCO controls shown are a fine tune varactor with gain $K_{VCO}$ and a coarse tune varactor whose gain is scaled by a factor $O_c$ relative to $K_{VCO}$ (i.e., $O_c K_{VCO}$).

The coarse tune control voltage on capacitor $C_F$ 6 is set during frequency acquisition by a separate charge pump FCP 4. This particular figure shows lock-to-reference frequency acquisition, although in other embodiments frequency acquisition technique locks on data. Once frequency acquisition is completed, the charge pump FCP 4 is disabled and a drift or leakage compensation is enabled to adjust the voltage on the capacitor $C_F$ 6.

Feedback for drift compensation includes an integrator (i.e., Gm 5 and CF 6) which controls the coarse tune varactor. Drift compensation keeps a voltage on a fine tune varactor in the middle of its tuning range. A zero formed by summing the gains of the fine tune path and drift compensation path should be in the low Hz range to avoid excessive peaking in the jitter transfer frequency response. One consequence of having such a low bandwidth is that capacitor CF 6 must be a large off-chip capacitor. In fact, capacitor CF operates in the milli-farad range, which is very large device. Thus, there is a need for a smaller, on-board drift compensation circuit.

The Phase Shifter 7 implements a variable delay analog first-in-first-out (FIFO) on data. The Phase Shifter 7 implementation is limited because it has a restricted range of tunable delays, it is not readily amenable to covering multiple octaves of data rates, and its bandwidth must change with frequency to maintain the same gain and phase shift range. Continuous-rate CDRs covering multiple octaves generally have to employ different phase shifters for ranges of octaves, as well as multiple stages of phase shifters within each range. Thus, there is also a need for a device with as close to limitless phase shift delays as possible; and amenable to covering multiple octaves of data rates without resorting to different devices for different octaves.

A need therefore exists for a clock recovery circuit, with programmable delay and bandwidth, without large on (and off) chip analog components, and that is capable of operating over multiple octaves. Other disadvantages of the prior art may also be overcome by the present invention.

SUMMARY OF THE INVENTION

The present invention is in part, based on the realization that significant advantages and benefits may be achieved by utilizing separate integrators in the DLL and PLL of a D/PLL system. Among the advantages are a more stable circuit; low jitter transfer bandwidth; and scaling of the bandwidth of drift compensation with data rate frequency.

Exemplary embodiments consistent with the present invention provide a method and apparatus for obtaining a continuous-rate recovered clock with advantages over the prior art. According to one aspect of the present invention, a continuous-rate clock and data recovery circuit is provided that includes a delay locked loop with an infinite phase shifter; and a phase locked loop with a digitally tunable oscillator. In this aspect, the delay locked loop with the infinite phase shifter and the phase locked loop with the digitally tuned oscillator are in a dual loop architecture.

According to another aspect of the present invention, a method for generating a continuous-rate clock is provided that includes receiving a clock signal at a delay lock loop and phase lock loop; in the delay lock loop, adjusting the clock signal by increasing a phase offset of the clock signal based on a value of a first digital accumulator and a look-ahead value; and in the phase lock loop, adjusting control logic of a source of the clock signal based on the value of a second digital accumulator.

According to another aspect of the present invention, a continuous-rate clock and data recovery circuit is provided that includes a delay locked loop with a first digital integrator; and a phase locked loop with a second digital integrator independent from the first digital integrator.

The foregoing and other features and advantages of the present invention will be made more apparent from the description, drawings, and claims that follow. One of ordinary skill in the art, based on this disclosure, would understand that other aspects and advantages of the present invention exist.

DETAILED DESCRIPTION OF THE EXEMPLARY EMBODIMENTS

Figure 2:
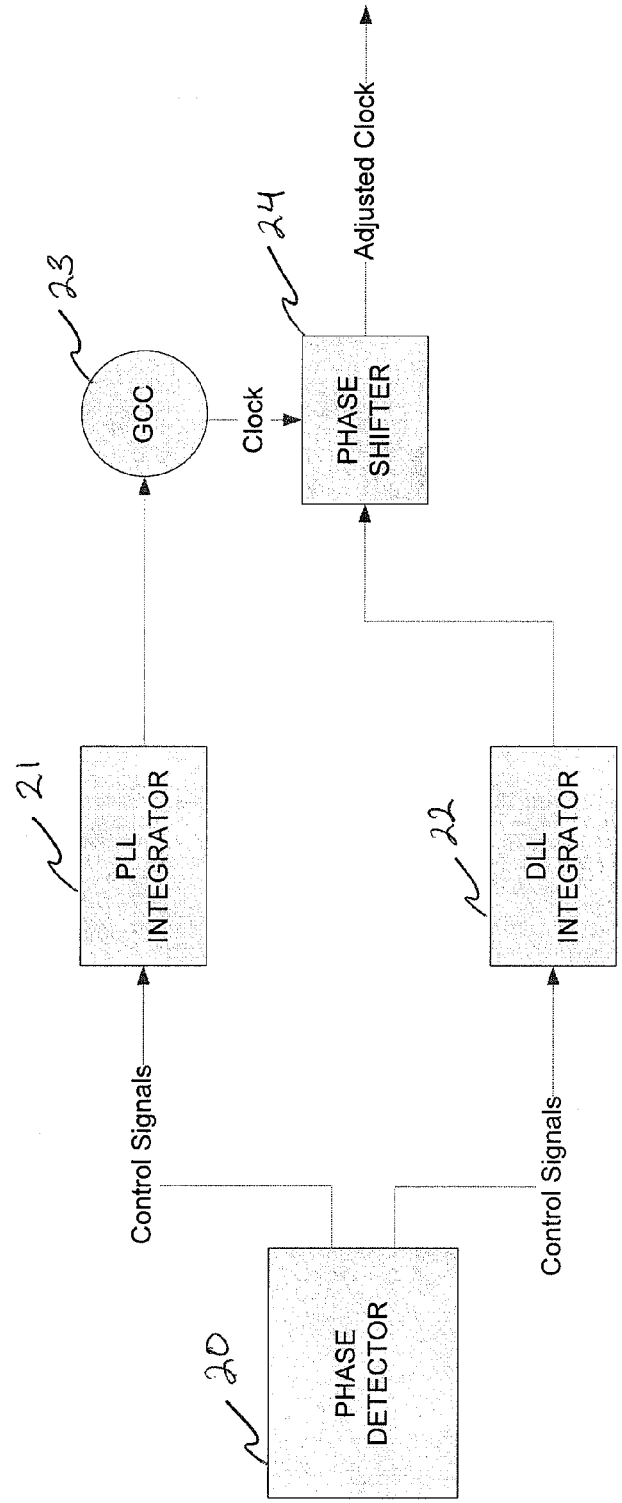
FIG. 2 is a block diagram of a digital D/PLL according to an exemplary embodiment of the present invention.

The present invention is in part, based on the realization that significant advantages and benefits may be achieved by utilizing separate integrators in the DLL and PLL of a D/PLL system. FIG. 2 illustrates a D/PLL system according to an exemplary embodiment of the present invention. The D/PLL in FIG. 2 includes a Phase Detector 20, a PLL Integrator 21, a DLL Integrator 22, a Clock Generation Circuit (GCC) 23, and a Phase Shifter 24.

Figure 1:
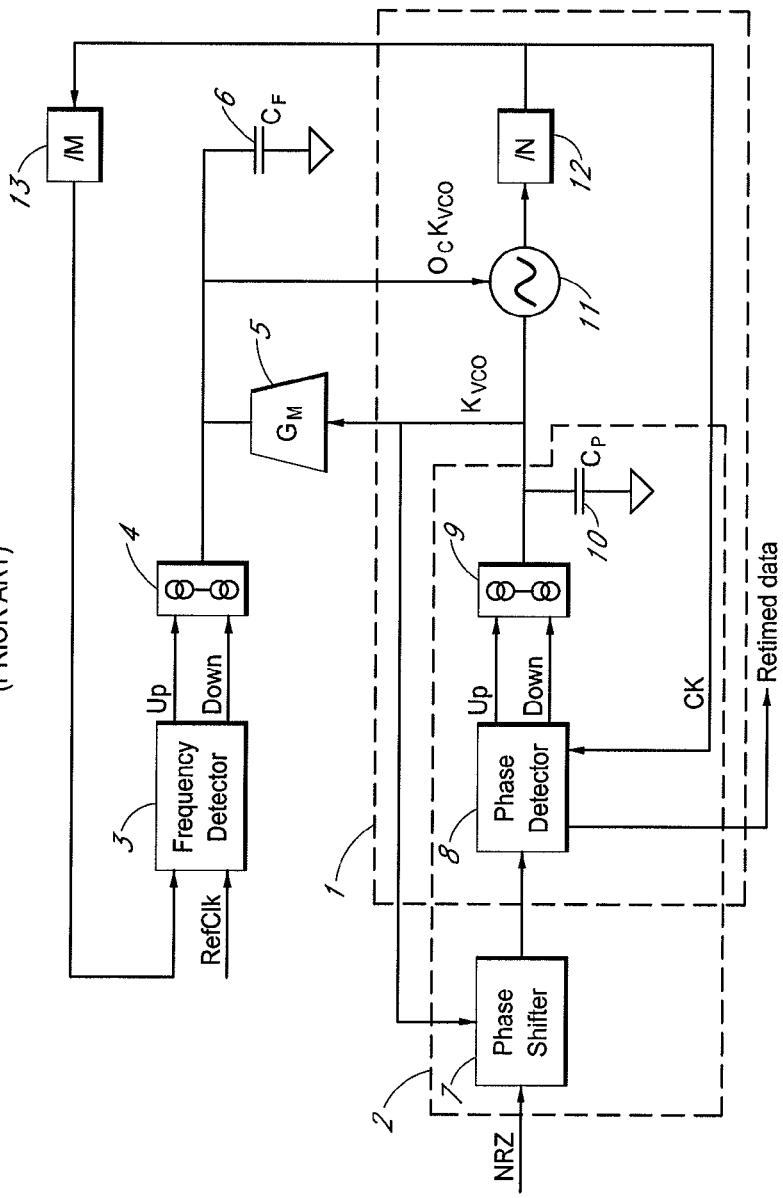
FIG. 1 is a block diagram of a prior art analog D/PLL.

The PLL Integrator 21 and DLL Integrator 22 replace the phase charge pump PhCP 9 in the prior art D/PLL illustrated in FIG. 1. In this exemplary embodiment, the separation of PLL Integrator 21 and DLL Integrator 22 is implemented in the digital domain.

Figure 3:
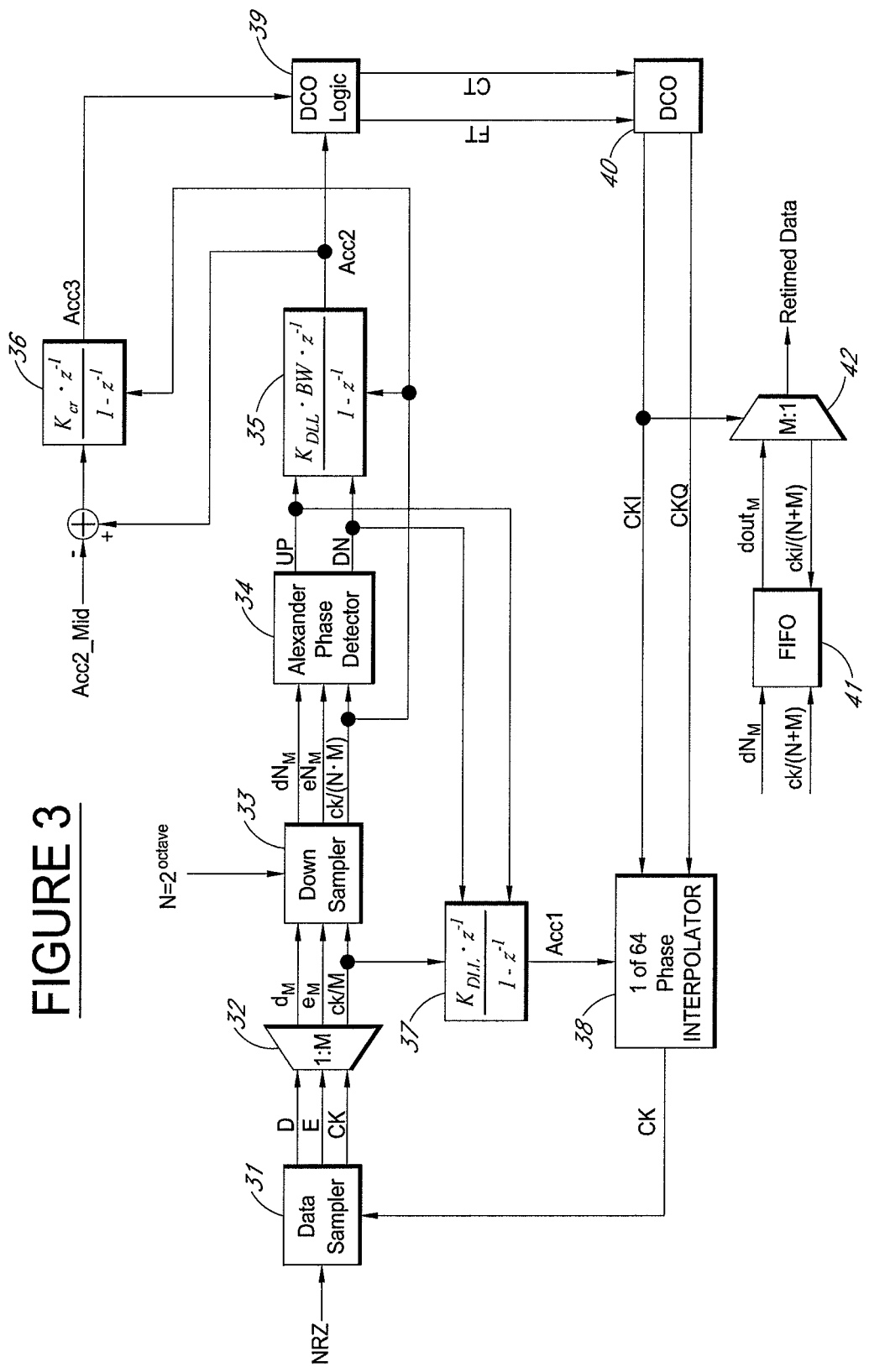
FIG. 3 is a block diagram of a digital D/PLL according to another exemplary embodiment of the present invention.

FIG. 3 illustrates a digital D/PLL system 30 according to another exemplary embodiment of the present invention. In this embodiment, the digital integrators are implemented as digital accumulators.

D/PLL Circuit

Referring to FIG. 3, the D/PLL 30 system includes a Data Sampler 31, a 1:M Deserializer 32, Down Sampler 33, Alexander Phase Detector 34, accumulator Acc1 37, Bits-to-Phase Interpolator 38, digital accumulator Acc2 35, digital accumulator Acc3 36, Digitally Controlled Oscillator (DCO) Logic 39, the DCO 40, a digital FIFO 41, and a serializer 42. The Data Sampler 31, 1:M Deserializer 32, Down Sampler 33, and Alexander Phase Detector 34 are common to the PLL and DLL. Acc1 37 and Bits-to-Phase interpolator 38 are part of the DLL. Acc2 35, Acc3 36, DCO Logic 39 and DCO 40 are part of the PLL. The serializer 42 transmits a down-sampled tuned clock signal to the digital FIFO 41.

Acc1 and Acc2

Accumulators Acc1 37 and Acc2 35 act as digital integrators in this digital D/PLL Acc1 37 is a wrapping accumulator. Because Acc1 37 wraps upon exceeding either its minimum or maximum value, it provides near infinite phase shifting in conjunction with the Bits-To-Phase Interpolator 38. Infinite phase shift allows for maintained feedback even when there is a frequency mismatch between the output of the DCO 40 and the data rate frequency. For example, the outputs (UP and DN) of the Alexander Phase Detector 34 may change at the rate of ck/(N+M), where N is the data rate and M is the size of code-word deserialized by the 1:M Deserializer 32. Acc1 37 is clocked at a rate of ck/M, which is N times the higher than the Alexander Phase Detector 34.

Acc2 35 saturates at its minimum and maximum values rather than wrapping. If Acc2 35 wrapped, the DCO would go from maximum output frequency to its minimum output frequency or from its minimum output frequency to its maximum output frequency for a given DCO segment, destabilizing the generated clock signal. As the outputs (UP & DN) of the Alexander Phase Detector 34 change at the rate of ck/(NM), Acc2 36 is also clocked at a rate of ck/(NM). Jitter transfer bandwidth scales by 1/N because Acc1 37 is at an N times higher rate than Acc2 36. It is highly desirable to have jitter transfer bandwidth track rate.

Acc3

Acc3 36 replaces the transconductance $G_m$ 5 and off-chip capacitor $C_F$ 6 of the prior art system illustrated in FIG. 1. If Acc2 35 locks at the top or bottom of its range, there is no room to compensate for drift. Acc3 36 drives Acc2 35 to the middle of its value range so that Acc2 35 may compensate for drift. Driving Acc2 35 to its mid-value provides for some room to adjust for drift. Further, utilizing Acc3 36 to drive Acc2 35 to the middle of its range is advantageous because the drift compensation can have a long time constant by adding more bits to the Acc3 36 and operating at a reduced clock frequency. Moreover, the bandwidth of the drift compensation circuitry, Acc2 35, scales with the data rate frequency, which was not possible in the prior art.

Alexander Phase Detector

The Alexander Phase Detector 34 generates a phase error signal $eN_m$ (i.e., the phase difference) between two signals, in this case the reference clock Ck/(N·M) and the data signal dN. The signal $eN_m$ may be implemented so the user can select whether phase errors are computed on rising data transitions, falling data transitions or both rising and falling data transitions. Selecting a polarity of transitions to compute phase errors in an Alexander style phase detector eliminates jitter induced by duty cycle distortion (DCD) on the data. DCD creates a dead band in an Alexander Phase Detector 34, which leads to jitter in the retiming clock. Retiming jitter is a problem if the recovered clock is forwarded to another CDR system.

Bits-to-Phase Interpolator

Figure 4:
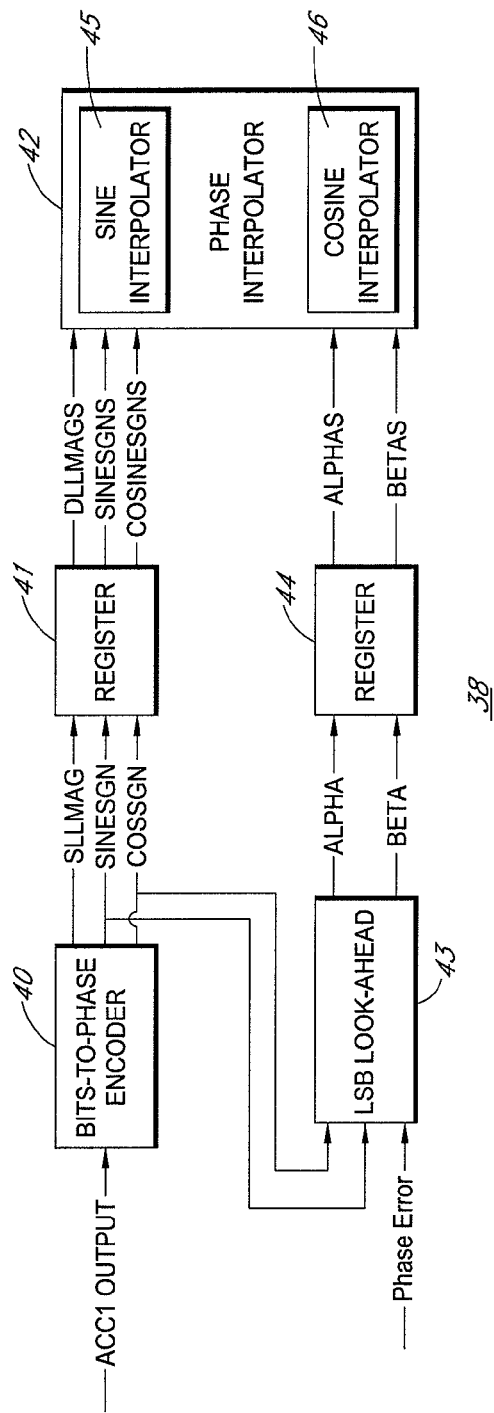
FIG. 4 is a block diagram of a Bits-to-Phase Interpolator according to an exemplary embodiment of the present invention.

With reference to FIG. 4, the Bits-to-Phase Interpolator 38 includes Bits-to-Phase Encoder 40, Register 41, Phase Interpolator 42, LSB (least-significant-bit) Look-Ahead 43, and Register 44. In this exemplary embodiment, Registers 41 and 44 merely absorb timing differences.

The Bits-to-Phase Encoder 40 takes the values from Acc1 37, and generates control signals for the Phase Interpolator 42. The phase error from the Alexander Phase Detector 34 and the control signals to the Sine Interpolator 45 and Cosine Interpolator 46 of the Phase Interpolator 42 are fed forward to LSB Look Ahead 43, which generates signals alpha and beta that control gain elements within the Phase Interpolator 42 that shift the output phase of the Phase Interpolator 52 (i.e., shifts the phase of CKI). The feed forward path reduces latency in the DLL, leading to smaller limit cycles.

Exemplary Operation of the D/PLL

An exemplary operation of the D/PLL will now be described with reference to FIGS. 5 to 17.

Figure 5:
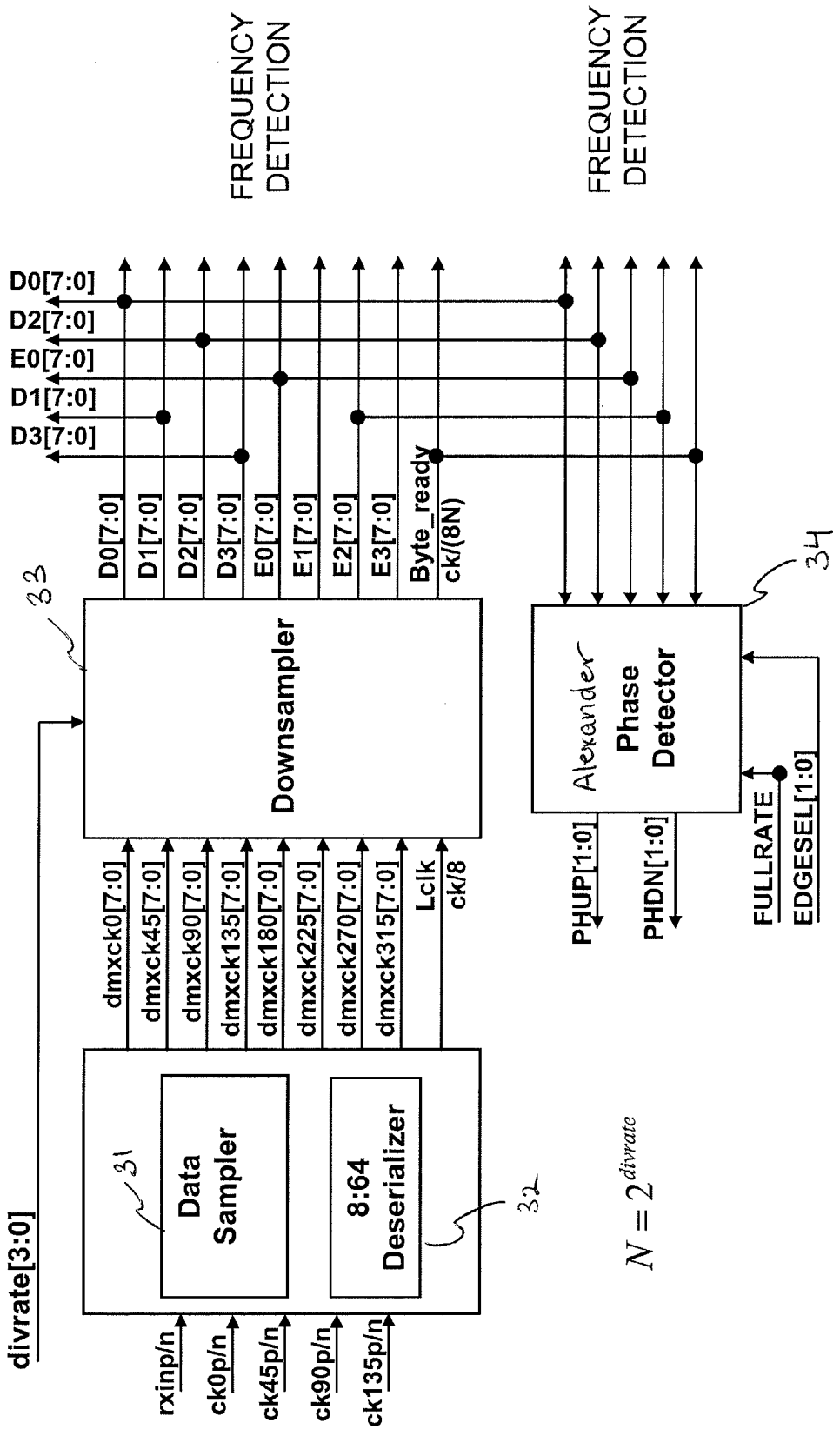
FIG. 5 is a block diagram of part of a digital D/PLL according to a particular implementation of the digital D/PLL in FIG. 3.

FIG. 5 is a an implementation of the phase and frequency detector according to an exemplary embodiment of the present invention.

The Data Sampler 33 grabs the received data din (see FIG. 6) on eight edges of a high-speed clock (4 extra edges are for a rotational frequency detector). The data are deserialized into 8 bytes, and the incident clock ck0p/n is divided by 8 to generate a signal (Lclk) which clocks the synthesized digital circuitry that includes the Down Sampler 33, Alexander Phase Detector 34, and all digital accumulators, Acc1 37, Acc2 35, and Acc3 36, within the loop filter.

The amount of deserialization is limited by the highest clock frequency that where the synthesized digital logic implements the Down Sampler 33 and digital filtering satisfy critical timing specifications of the underlying static CMOS logic. More stages of deserialization may be necessary when the static CMOS gates are slow. One problem with adding stages of deserialization is that additional stages contribute latency in the high-speed proportional gain path of the PLL. Latency in a either a DLL or a PLL employing a binary phase detector creates jitter in the form of limit cycle oscillations on the recovered clock. Limit cycle oscillations increase jitter generation, and degrade jitter tolerance.

The Down Sampler 33 (implemented here in static CMOS) receives the bytes of deserialized data {dmxck0, . . . , dmxck270} and parses that data into new bytes {D0, . . . , E3}. Parsing is determined by the programmable division rate, divrate[3:0]. Fewer data paths from the Deserializer 32 are used as the division rate is increased. Logic in unused paths of the Down Sampler 33 can be powered off. Powering off may entail removing the bias for current-mode logic (CML) or removing the clock for static CMOS circuitry.

Figure 6:
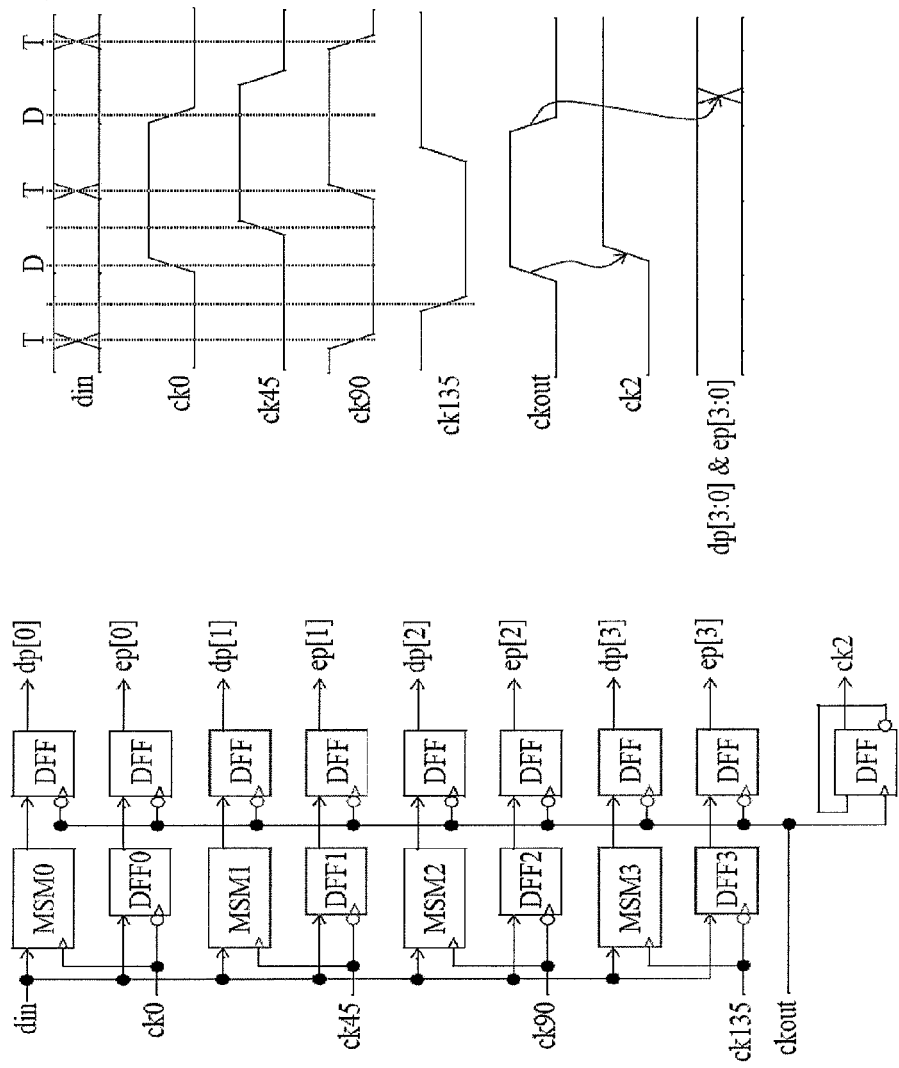
FIG. 6 is a circuit and timing diagram illustrating half-rate sampling.

FIG. 6 shows the high frequency portion of the Data Sampler 31 core where NRZ data appears on din. The data are sampled on up to 8 clock phases (i.e., both edges of ck0p/n, ck45p/n, ck90p/n, ck135p/n). of the clocks are illustrated in FIG. 6. MSM[k], where k={0, 1, 2, 3} is a master-slave-master flip-flop (i.e., three latches) that grab din on rising clock edges, while DFF[k] is a master-slave flip flop (i.e., two latches) that grabs data on falling clock edges. The outputs of MSM[k]/DFF[k] change on the falling edge of the applied clock; e.g., the outputs of MSM[1] and DFF[1] can change states on the falling edges of ck45. Eight falling-edge flip flops align the data dp[k]/ep[k] to the falling edge of ckout so that all of the data are on a single clock domain for subsequent deserialization.

Figure 7:
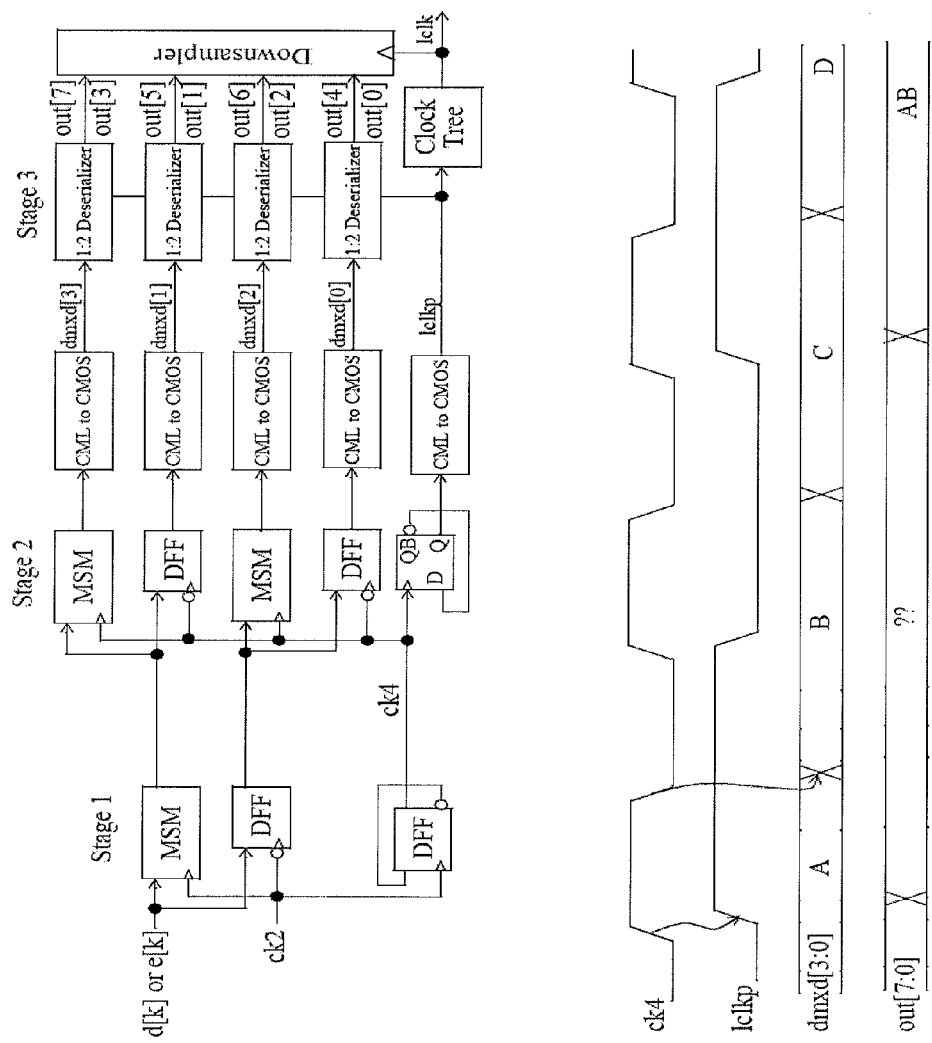
FIG. 7 is a circuit and timing diagram illustrating a deserializer according to an exemplary embodiment of the present invention.

All eight data streams are further deserialized by a factor of 8. One possible implementation of a 1:M Deserializer 32 is shown in FIG. 7 as a 1:8 deserializer. The 1:M Deserializer 32 architecture is a binary tree, which is known to those of ordinary skill in the art. Other deserialization architectures and factors can be used. In addition to data, the 1:M Deserializer 32 also provides a low frequency clock (lclk) that is used to clock the digital logic in the Alexander Phase Detector 34 and frequency detector (not shown).

In this exemplary embodiment, the Down Sampler 33 receives 64 bits in groups of 8-bit bytes and determines how to route those bits to a new set of bytes denoted as D0, D1, D2, D3, E0, E1, E2, and E3 (see FIG. 5). Bit assignments between the Deserializer 32 and Down Sampler 33 shall be described next.

Half-rate sampling employs a rate clock that is one half the bit rate. A continuous-rate CDR can employ half rate sampling in the highest octave of data rates to maximize serial bit rate for a given semiconductor process node (e.g., half rate sampling has been heavily used in 0.13 µm CMOS to realize 10 Gbps operation).

As illustrated in FIG. 6, the Data Sampler 31 has eight flip-flops that sample on rising and falling edges of ck0, ck45, ck90 and ck135. Rising edge samples are dp[3:0], and falling edge samples are ep[3:0]. All eight flip-flops are required during lock-to-data frequency acquisition. Recovered data D appears on two bits that are interleaved in time. The first bit, which is sampled on rising edges of ck0, is denoted as dp[0]. The second bit, which is sampled on falling edges of ck0, is denoted as ep[0]. Transition bits dp[2], and ep[2] are grabbed on rising and falling edges of ck90 respectively. Flip flops on ck135 and ck45 sample ¼ UI and ¾ UI across the eye on both edges to yield dp[3]/ep[3] and dp[1]/ep[1].

These data are used by the rotational frequency detector (not shown). Their outputs can also be used to monitor the severity of jitter on the received signal; e.g., a HIGH logic value from the exclusive—or of dp[1] with dp[0] shows that there is more than 0.25 UI of jitter on the data relative to the clock. Flip flops and clock buffers associated with ck45 and ck135 can be power cycled after acquisition as they are only required in monitoring the locked state of the D/PLL.

Down sampling in the half-rate sampling mode is the most straightforward case as there is none; note that the division rate relative to the clock frequency is −1. On every rising edge of Lclk, the bytes are mapped from the input to output of the Down Sampler 33 according to the following definitions {d0=dmxck0, d1=dmxck45, d2=dmxck90, d3=dmxck135, e0=dmxck180, e1=dmxck225, e2=dmxck270 and e3=dmxck315}. There is an additional bit byte_ready that tells the phase and frequency detector when the data is valid. This bit is held high for all cycles of Lclk. The period of byte_ready equals the period of ck/(N+M) in FIG. 3; duty cycles for byte_ready and ck/(N+M) are an implementation detail. In half rate mode, the phase detector uses bytes {d0, e0, d2 e2}, while the frequency detector uses all eight bytes {d0, d1, d2, d3, e0, e1, e2 and e3}.

Figure 8:
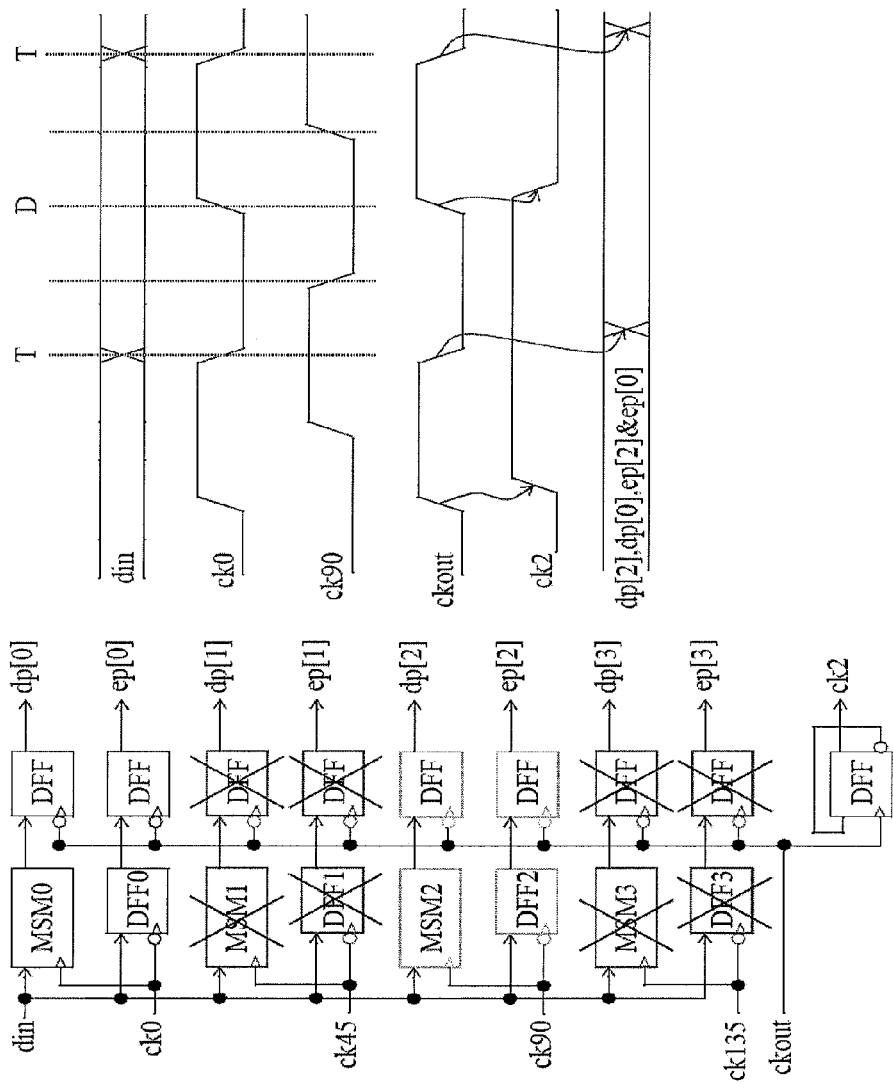
FIG. 8 is a circuit and timing diagram illustrating full rate sampling.

In the full rate mode shown in FIG. 8, flip flops and clock drivers associated with clocks ck45 and ck135 are powered off as bytes d1, d3, e1 and e3 are no longer required. Mapping from input to output follows the plan {d0=dmxck0, d2=dmxck90, e0=dmxck180, e2=dmxck270}. Byte_ready is always HIGH in full rate.

Recovered data bits are on dp[0], while transition bits are on ep[0]. Flip flops clocked by ck90 sample din at ¼ UI and ¾ UI into the eye of the data, when the CDR is locked. These samples are used by the rotational frequency detector (not shown). Clock domain transfers from ck0 and ck90 to ckout are identical to ones in the half rate example so the underlying circuit remains unchanged.

Figure 9:
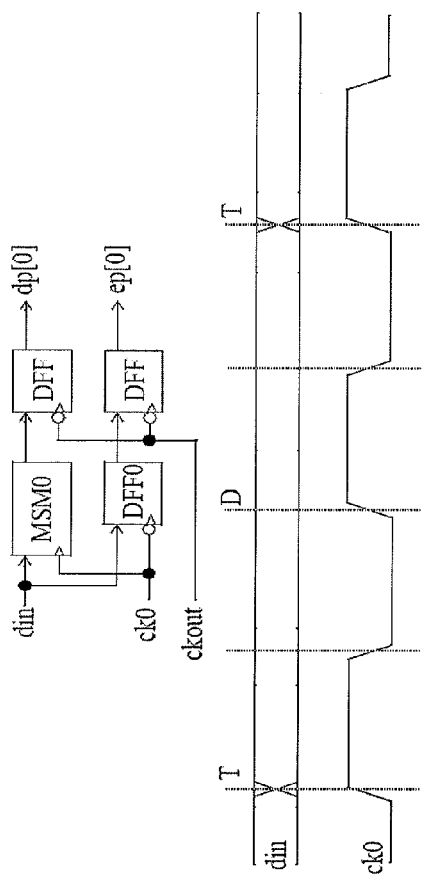
FIG. 9 is a circuit and timing diagram illustrating oversampling by a factor of two.

Referring to FIG. 9, the oversampled by 2 mode is shown, where every other sample of dp[0] is a recovered data bit. Bits of dp[0] that are not data bits are transition bits that drive the Alexander Phase Detector 34. Two samples of deserialized data are required to construct d0, d2, e0 and e2.

On the first cycle of Lclk, the 4 MSBs of d0, d2, e0 and e2 are written according to these bit assignments:

TABLE 1

1st Cycle if Lclk Bit Assignments d0[7]=dmxck0[7], d0[6]= dmxck0[5], d0[5]=dmxck0[3], d0[4]= dmxck0[1]
e0[7]=dmxck0[6], e0[6]= dmxck0[4], e0[5]=dmxck0[2], e0[4]= dmxck0[0]
d2[7]=dmxck180[7], d2[6]= dmxck180[5], d2[5]=dmxck180[3], e2[4]= dmxck180[1]
e2[7]=dmxck180[6], e2[6]= dmxck180[4], e2[5]=dmxck180[2], e2[4]= dmxck180[0]

On the second cycle of lclk, the 4 LSBs of d0, d2, e0, and e2 are written according to these bit assignments

TABLE 2

2nd Cycle if Lclk Bit Assignments d0[3]=dmxck0[7], d0[2]= dmxck0[5], d0[1]=dmxck0[3], d0[0]= dmxck0[1]
e0[3]=dmxck0[6], e0[2]= dmxck0[4], e0[1]=dmxck0[2], e0[0]= dmxck0[0]
d2[3]=dmxck180[7], d2[2]= dmxck180[5], d2[1]=dmxck180[3], e2[0]= dmxck180[1]
e2[3]=dmxck180[6], e2[2]= dmxck180[4], e2[1]=dmxck180[2], e2[0]= dmxck180[0]

Byte_ready is set HIGH upon the LSBs of e2 being written, and returned to a logic LOW state on the next cycle of lclk. The number of lclk cycles between rising edges of byte_ready captures the oversampling rate. For division_rate>=0 the duty cycle of byte_ready is $2^{-division\_rate} \cdot (1-2^{-division\_rate})$, where the first number is the fraction of time byte_ready is HIGH and the second number is the fraction of time it is LOW.

An advantage of the oversampling architecture is evident at oversampling rates of 2 and higher. Static phase offset is a measure of how far the sampling instance that grabs the data bit D is from the middle of the data eye. In the full rate example, duty cycle distortion in ck0 would cause static phase offset. Duty cycle distortion can largely be eliminated through AC coupling of the clock. In the half rate case, quadrature mismatches between ck0 and ck90 would lead to static phase offset, while duty cycle distortion would create a dead band in the phase detector transfer function. There will be no static phase offset for oversampling rates of 2 or greater as both data and transition bits are all grabbed on rising edges of ck0.

Figure 10:
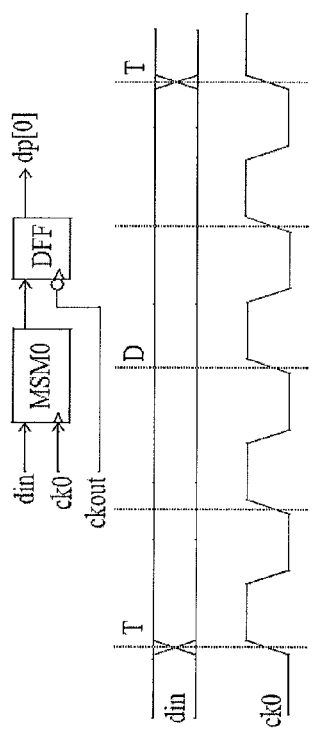
FIG. 10 is a circuit and timing diagram illustrating oversampling by a factor of four.

Referring to FIG. 10, all four data eye samples are taken on rising transitions of ck0, which means that flip flops, clock drivers and deserializers associated with the other seven clock domains can be powered off entirely.

Figure 11:
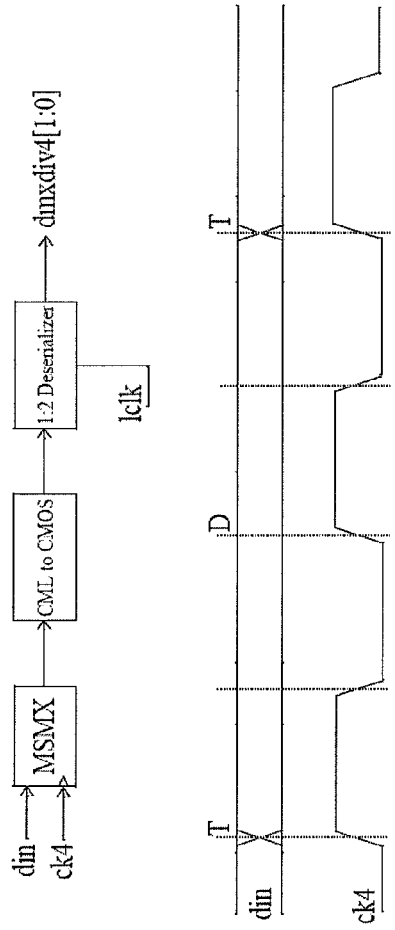
FIG. 11 is a circuit and timing diagram illustrating oversampling by a factor of sixteen.

Oversampling ratios>4 also use the circuit configuration in FIG. 10. Bits of dp[0] are ignored according to the value of division_rate. The case of 16× oversampling, illustrated in FIG. 11, provides an example to illustrate this point. Recovered data bits (D) are found in every 16th sample of dp[0], with transition bits T offset by 8 samples. Power cycling the rotational frequency detector when monitoring loss-of-lock provides no benefit, as the additional two samples of the eye are available for free. At 16× oversampling three of every four bits are discarded even with the rotational frequency detector enabled.

Figure 12:
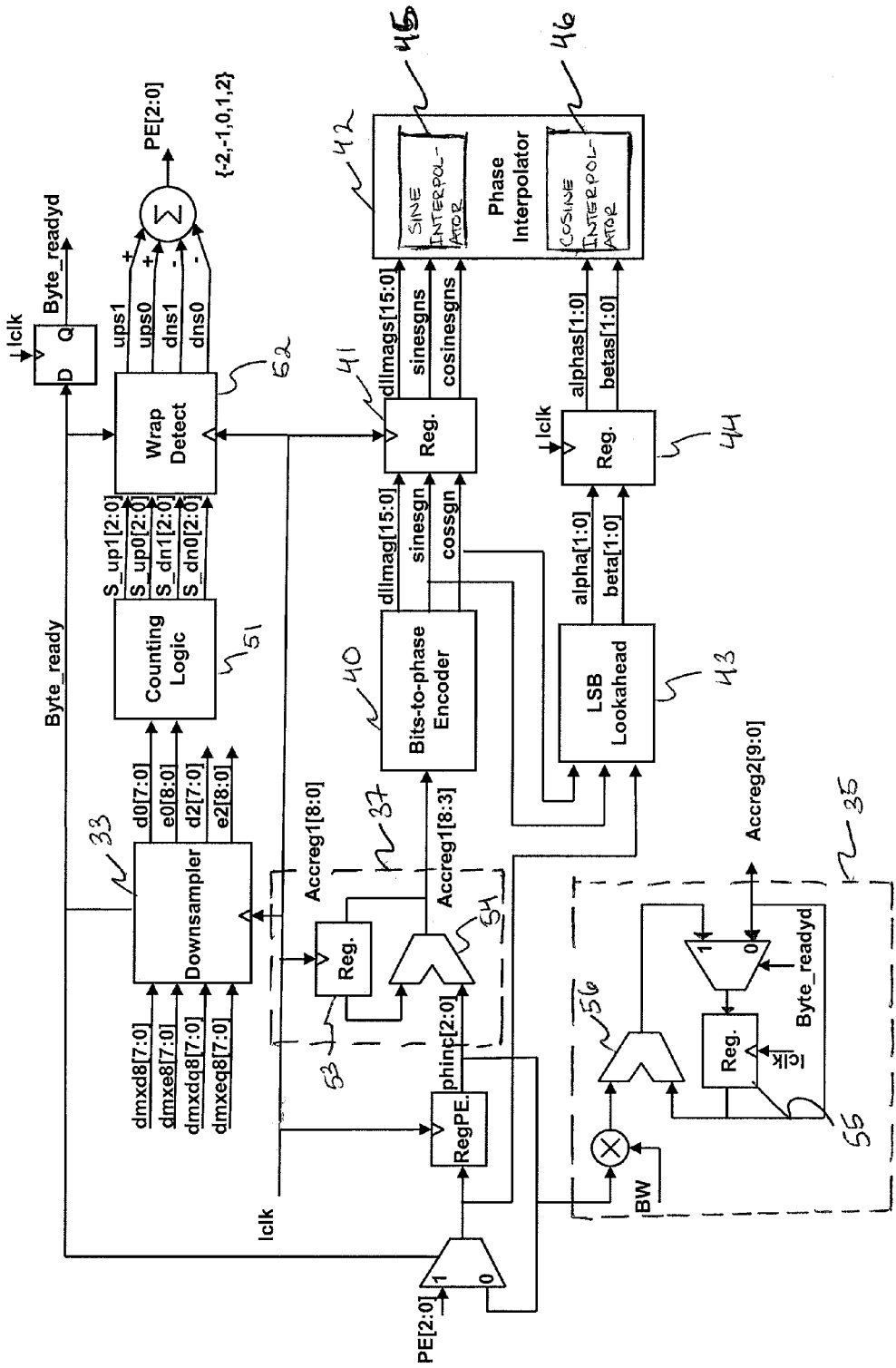
FIG. 12 is a block diagram of a digital D/PLL according to another exemplary embodiment of the present invention.

FIG. 12 shows a detailed picture of the logic in the Alexander Phase Detector 34 and DLL. The Alexander Phase Detector 34 consists of Counting Logic 34 and a Wrap Detect 35.

The Alexander Phase Detector 34 is implemented so the user can select whether phase errors are computed on rising data transitions, falling data transitions or both rising and falling data transitions. This user selectable option where only one polarity of transitions is used to compute phase errors in an Alexander style phase detector eliminates jitter induced by duty cycle distortion (DCD) on the data. DCD creates a dead-band in the binary phase detector transfer function, which leads to jitter in the retiming clock. Retiming jitter is mainly a problem if the recovered clock is forwarded to another CDR system. Two consequences to limiting phase computations to a single edge is that the phase detector gain gets halved, and the data sampling instance is no longer in the center of the data eye.

Figure 13:
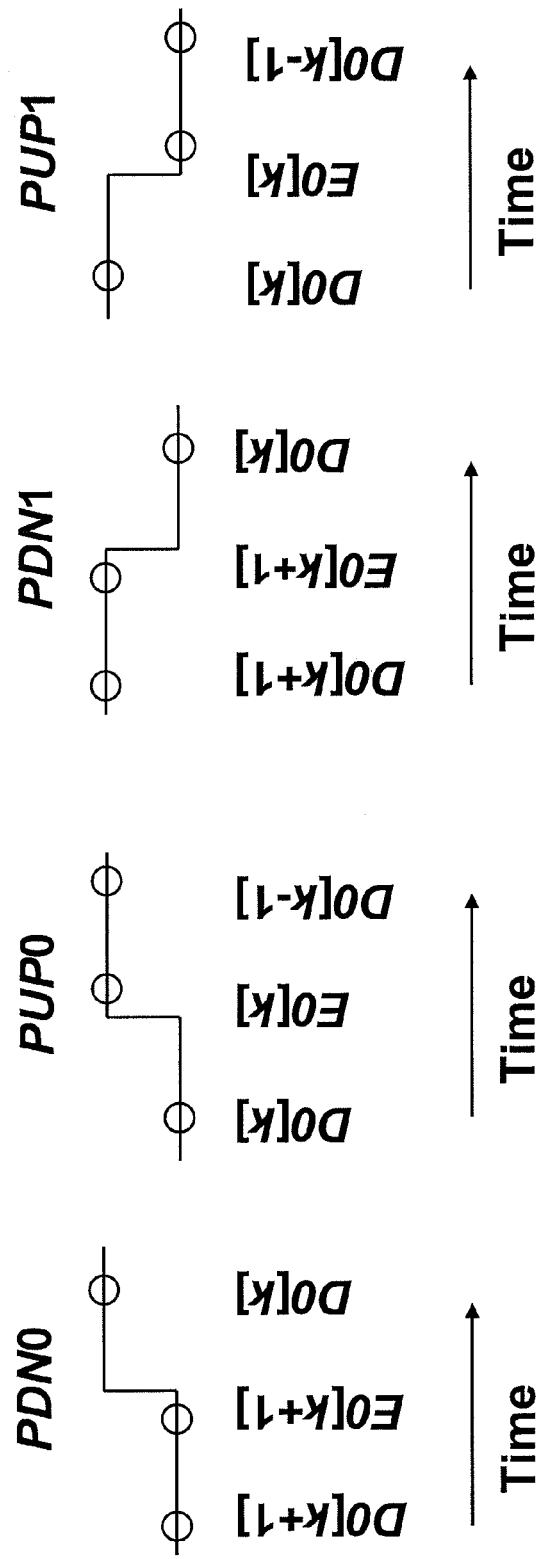
FIG. 13 is a timing diagram of an exemplary operation of a phase detector according to the exemplary embodiment of the present invention of FIG. 12.

As illustrated in FIG. 13, early sample clocks are shown as PDN0 for a rising data transition and PDN1 for a falling data transitions. In a traditional bang bang PLL, when an early sample clock is detected the VCO extends its period for one or more cycles so that subsequent sampling clocks move later in time. Extending a VCO period is equivalent to doing a frequency pump down. Hence, the notation PDN stands for frequency pump down. Late sample clocks are shown as PUP0 for a rising data transition and PUP1 for a falling data transitions. When a late sample clock is detected a VCO reduces its period for one or more cycles so that the subsequent sampling clocks move earlier in time. Reducing a VCO period is equivalent to doing a frequency pump up.

The Alexander Detector 34 with division rate≧0 will now be described according to an exemplary embodiment of the invention.

A PDN0[$k$] for each k=0 to 7 is HIGH when a LOW edge or transition bit precedes a HIGH data bit. The equation (Equation 1) for detecting this pattern is:

$$\overline{E0[k+1]} \cdot D0[k] \qquad \text{(Equation 1)}$$

A bridge bit spanning 2 symbols of down sampled data has e0[8] equal to the stored value of e0[0] from the previous down sampled word period.

Simplifications to the logic for counting transitions within a down sampled data word period are made possible by the realization that it is impossible to satisfy the logic of PDN0 on two adjacent bits in a single symbol, as there cannot be two consecutive rising data transitions. As a result, there can be at most four PDN0 in the span of a byte worth of transitions.

A PDN1 [$k$] for each k=0 to 7 is HIGH when a HIGH edge or transition bit precedes a LOW data bit. The equation (Equation 2) for detecting this pattern is:

$$E0[k+1] \cdot \overline{D0[k]} \qquad \text{(Equation 2)}$$

The inputs to the logic that counts the sums PDN1 in a down sample symbol period are 8-bit vectors:

$$A = E0[8:1] \qquad \text{(Equation 3),}$$

$$B = \overline{D0}[7:0] \qquad \text{(Equation 4)}$$

The sum S is a number between 0 and 4.

A PUP0[$k$] for each k=0 to 7 is HIGH when a LOW data bit precedes a HIGH transition bit. The equation (Equation 5) for detecting this event is:

$$E0[k] \cdot \overline{D0[k]} \qquad \text{(Equation 5)}$$

The inputs to the logic that counts the sums the number of PUP0's in a down sample symbol period are 8-bit vectors:

$$A = E0[7:0] \qquad \text{(Equation 6),}$$

$$B = \overline{D0}[7:0] \qquad \text{(Equation 7)}$$

The output sum S is a number between 0 and 4.

A PUP1[$k$] for each k=0 to 7 is HIGH, when a HIGH data bit precedes a LOW transition bit. The equation (Equation 8) for detecting this event is:

$$D0[k] \cdot \overline{E0[k]} \qquad \text{Equation 8}$$

The inputs to the logic that counts the sums the number of PUP's in a down sample symbol period are 8-bit vectors:

$$A = \overline{E0}[7:0] \qquad \text{(Equation 9),}$$

$$B = D0[7:0] \qquad \text{(Equation 10)}$$

The output sum S is a number between 0 and 4.

The Wrap Detect 52 sits at the output of the Counting Logic 40 and detects that the count logic has wrapped because of the number of pump ups or pump downs using the definitions provided for PUP0, PUP1, PDN0 and PDN1. The function of the Wrap Detect 52 could also be achieved by increasing the size of the respective registers.

Figure 14:
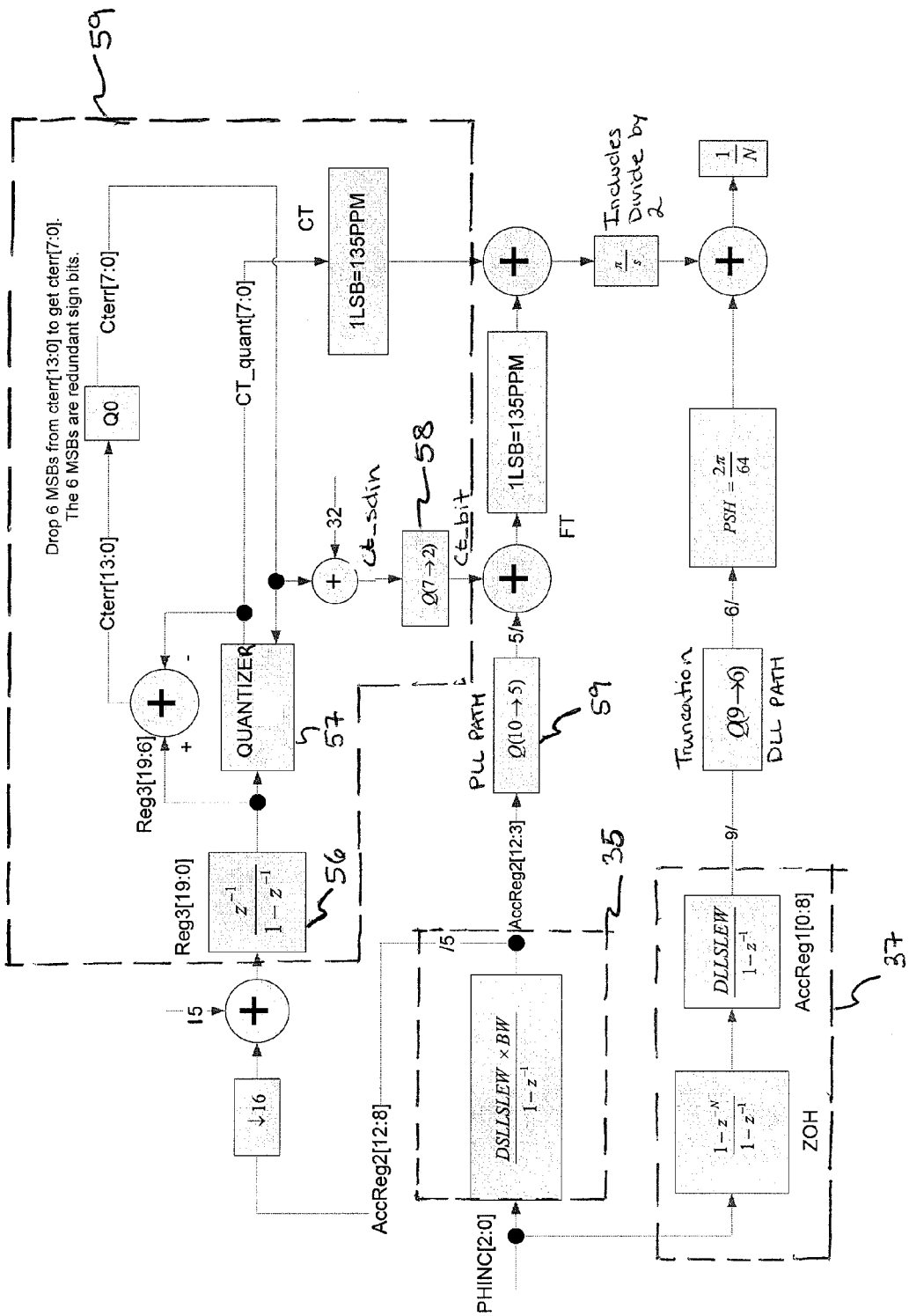
FIG. 14 is a flow diagram of an exemplary operation of the digital D/PLL according to the exemplary embodiment of the present invention of FIG. 12.

Turning now to the integrators, Acc1 37 and Acc2 35, with reference to FIGS. 12 and 14, PHINC is scaled by a factor of DLLSLEW at the inputs of the registers of Acc1 37 and Acc2 35. DLLSLEW is a value between 1 and 4 that sets the slew rate of the DLL path. Higher slew rate means the DLL can track more high-frequency sinusoidal jitter at the expense of higher clock jitter attributable to limit cycle oscillations. DLLSLEW is nominally chosen to be 3 as this achieves the best compromise between tracking sinusoidal jitter and jitter generation from limit cycle oscillations. A DLL with a binary phase detector (i.e., the Alexander Phase Detector 34) acts on phase the same way that an A/D using delta modulation acts on voltages.

The contents of accreg1 53 are quantized to six bits by dropping the three LSBs. Word accreg1 [8:3] is applied to the Bits-to-Phase Interpolator 38, which is represented by the linear gain PSH=$2\pi/64$ in FIG. 14. The phase error prior to Acc1 37 is fed forward to a logic block called LSB Lookahead 43, which generates signals alpha[1:0] and beta[1:0]. These logic signals control gain elements within a Sine Interpolator 46 and Cosine Interpolator 47 that move the output phase by half a phase shifter LSB step. The feed forward path reduces latency in the DLL, leading to smaller limit cycles.

In addition to scaling by DLLSLEW, PHINC is multiplied by BW as it is applied to accreg2 55. Acc2 35 is a 13-bit accumulator, whose depth is a function of the required jitter transfer bandwidth. The minimum size fine tune varactor element within the DCO 40 has a step size between 100 PPM and 200 PPM. The FT varactor is shown as 1LSB=135 PPM in FIG. 14. Acc2 35 must be quantized from 13 bits to 5 bits. Truncation would lead to limit cycles in the output phase as the value of Acc2 35 would limit cycle between two values of FT at a slow rate. There would be significant peak-to-peak jitter generation on the recovered clock. Instead, Acc2 35 is quantized in 2 steps. The first step is to drop the 3 LSBs. The second step is to apply noise shaping techniques to the remaining 10 bits shown as accreg2[12:3]. Noise shaping is frequently called delta-sigma modulation.

Upon the loss of lock detector ascertaining that the frequency difference between data and clock is less than 250 PPM, the PLL is enabled. A Drift (or temperature) Compensation Loop 59 drives the frequency mismatch between the DCO 40 output frequency which is captured in the 14 MSBs of Accreg3 56, and the data rate to a 0 PPM offset.

The Drift Compensation Loop 59 drives an array of capacitors (not shown) under control of bit word coarse_tune_quant [7:0] so the average value of bit word accreg2[12:8] is 15. The Drift Compensation Loop 59 includes a factor of 16 Down Sampler 58, a 20-bit Integrator 56, a Quantizer 57 with hysteresis, and a 7:2 Delta-Sigma Modulator denoted (DSM2) 58. Registers and other memory elements within the Drift Compensation Loop 59 are clocked at a rate of lclk/(16/N).

According to an exemplary embodiment, one method of quantizing Accreg3 56 is to set coarse_tune_quant[7:0]=

Reg3[19:12]. An error signal cterr, which is further processed to center the DCO is the difference between Reg3[19:12] and coarse_tune_quant[7:0]. Simple truncation results in cterr[5:0] being equal to Reg3[11:6].

Mismatches between varactors on FT and varactors on CT potentially cause limit cycles on the LSB of coarse_tune_quant[7:0]. Hysteresis changes the threshold at which coarse_tune_quant is set equal to the MSBs from Accreg3 56. Cterr[13:0] is the difference between the 14 MSBs of Accreg3 56 and coarse_tune_quant[7:0] left-shifted by six bits. If the Quantizer 57 were a simple truncation, the value of cterr would be a 6-bit number between 0 and 63. Hysteresis in the Quantizer 57 is implemented so that when coarse_tune_quant increments by one LSB that cterr would have to be less than or equal to −16 before coarse_tune_quant could decrease by 1. Likewise, if coarse_tune_quant decreased by 1, cterr would have to be greater than or equal to 80 before coarse_tune_quant would increase by 1. Hysterisis is approximately equal to the one fourth the PPM step size for a coarse tune varactor, since 16 LSBs of cterr is one fourth of an LSB on coarse_tune_quant. The mechanism by which there can be limit cycle between two code words on CT is if mismatches between the fine tune and coarse tune varactors are on the order of half of the expected frequency step size from a unit sized varactor.

The quantization error cterr is processed at a frequency of ¼th lclk from 7 bits to 2 bits using noise-shaping techniques. The 2-bit output ct_bit, is added to the LSB of the fine tune control word, where the additional coarse tune precision is achieved by pulse width modulating a unit element of the fine tune varactor array.

Figure 15:
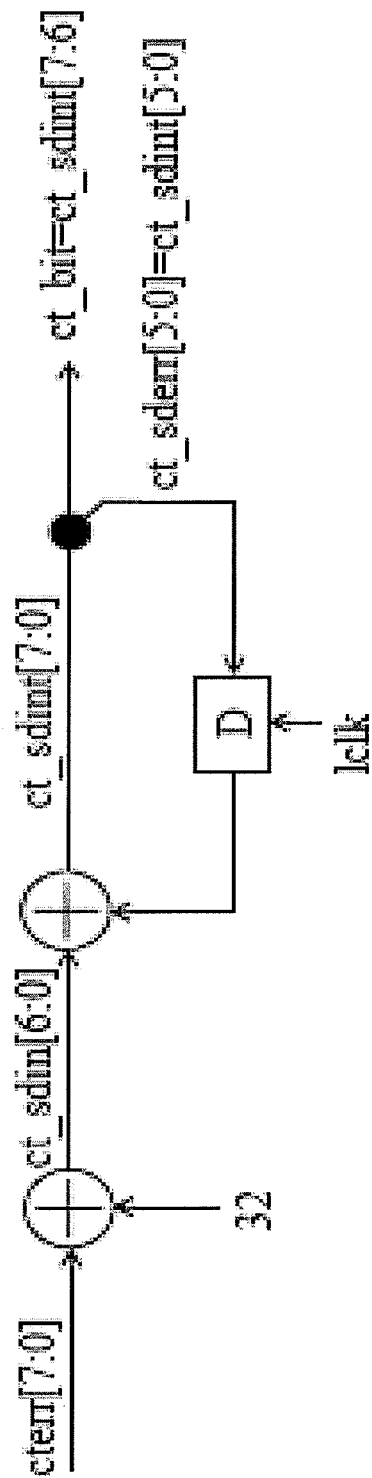
FIG. 15 is a flow diagram of an exemplary operation of part of the digital D/PLL of FIG. 12.

Implementation of the DSM2 58 according to an exemplary embodiment of the present invention is shown in FIG. 15. Eight bits are required on cterr to cover the span from −15 to +79. Bits cterr[13], . . . , cterr[8] are redundant sign bits that all equal cterr[7]. Hence, these six MSBS can be dropped from subsequent computations. A constant 32 is added to the midscale value of cterr to create ct_sdin, which is bounded by 16<ct_sdin<112. DC shifting the input by 32 reduces the input of DSM2 58 from an 8-bit number to a 7-bit number. A word ct_sdint[7:0] is the sum of the DSM2 58 input ct_sdin and the delayed quantization error. The delayed quantization error is the 5 LSBs of cd_sdint from the previous clock period. The output ct_bit is the 2 MSBs of ct_sdint[7:0].

Referring back to FIG. 14, Ct_bit, from DSM2 58 is added to the 5-bit output of DSM1 59 in the fine tune path to create a new 5-bit codeword that modulates 31 unit capacitors (not shown) providing fine tune (FT) control of the DCO 40. A zero is formed in the transfer function from the output of accreg2 55 to FT. This zero should be at a frequency that is 3 orders of magnitude lower than the jitter transfer bandwidth to limit jitter peaking to under 0.1 dB. In the case of a 10 Gbps serial data rate where the transfer bandwidth is 1.5 MHz, the zero should be less than 1.5 kHz. There is a transfer function of the form:

$$H_{DRIFT}(z) = 1 + K_{DRIFT}\frac{z^{-1}}{1-z^{-1}} \quad \text{(Equation 11)}$$

Equation 11 approximates the gain from DSM1 59 to FT: a gain of 1 is contributed by the straight through path; and a second term consisting of a constant gain $K_{DRIFT}$ and a digital integrator comprises the drift compensation. The number of bits in Accreg3 56 determines the drift compensation bandwidth. For reasons outside the scope of this patent, the gain from the output of Reg3 to ct_bit is 1. One of every 16 samples of Accreg2[12:8] is applied to Accreg3 56, with the other 15 samples being ignored. As a result, Accreg3 56 updates at a maximum rate of 5 MHz. From the discrete-time Fourier transform evaluated at f=1.5 kHz, and a sampling rate of Fs=10 GHz/16/16=39 MHz:

$$|H_{DRIFT}(e^{j2\pi\frac{f}{F_s}})| = \left|1 + K_{DRIFT}\frac{e^{-j2\pi\frac{f}{F_s}}}{1-e^{-j2\pi\frac{f}{F_s}}}\right| = 1. \quad \text{(Equation 12)}$$

This expression simplifies to:

$$K_{DRIFT} = 2\pi\frac{1.5 \text{ kHz}}{39 \text{ MHz}} = 2.4 \times 10^{-4} \quad \text{(Equation 13)}$$

Equation 13 is effectively 12-bits—i.e., log 2(2.4e-4)=12.01. The 12-bits from Equation 13 are added to the 8-bits of coarse tune control to specify a 20-bit accumulator for Accreg3 (i.e., Acc3 36 of FIG. 3); the LSB of the 8-bit word coarse_tune_quant is scaled identically through the varactors of the DCO 40 to the LSB of the 4-bit fine tune control word.

Figure 16:
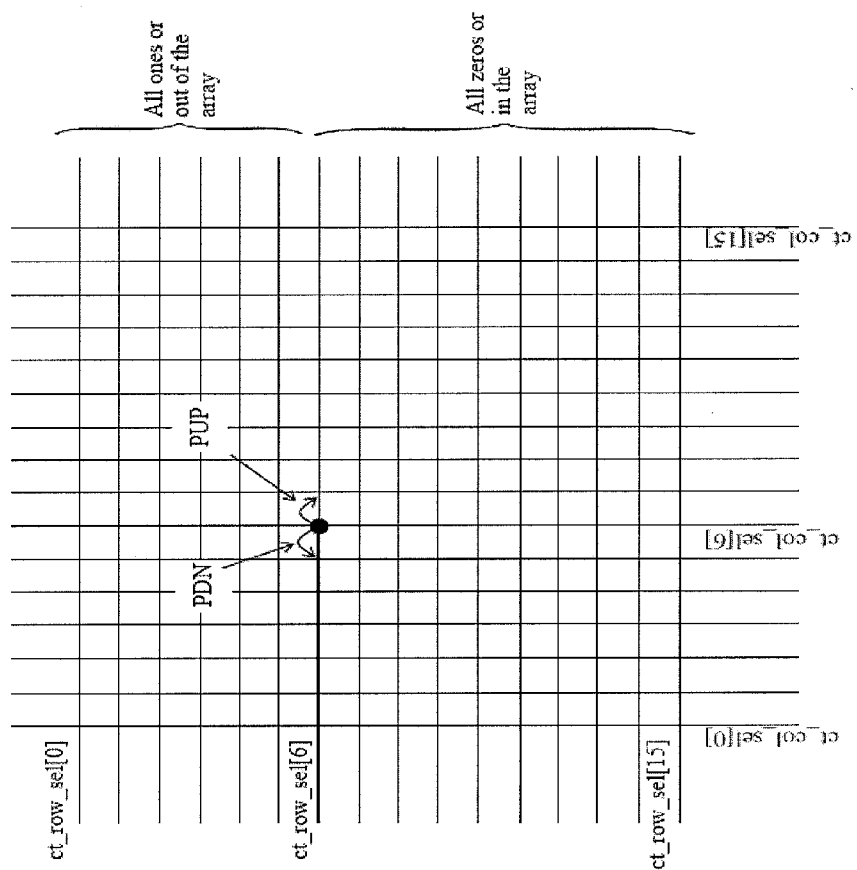
FIG. 16 is a diagram of a coarse turn array.
Figure 17:
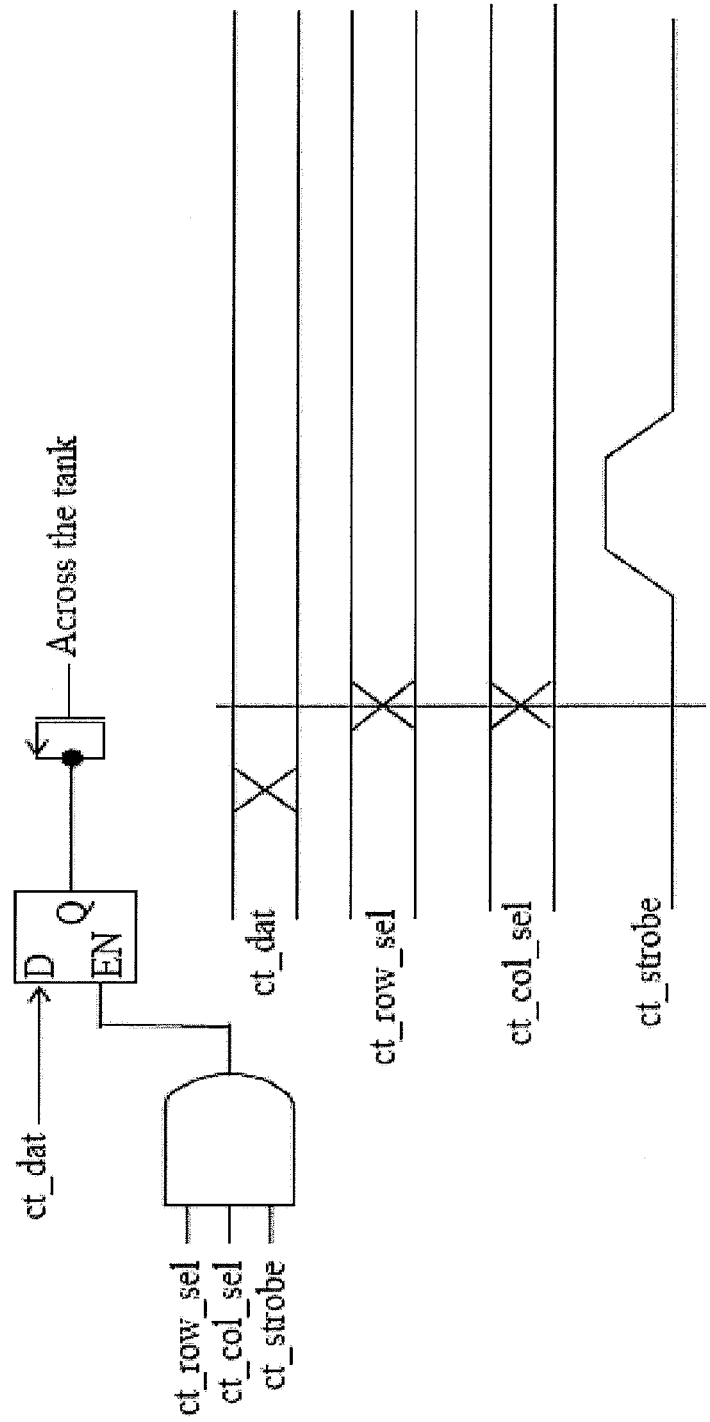
FIG. 17 is a circuit and timing diagram according to the exemplary embodiment of the present invention of FIG. 12.
Figure 18:
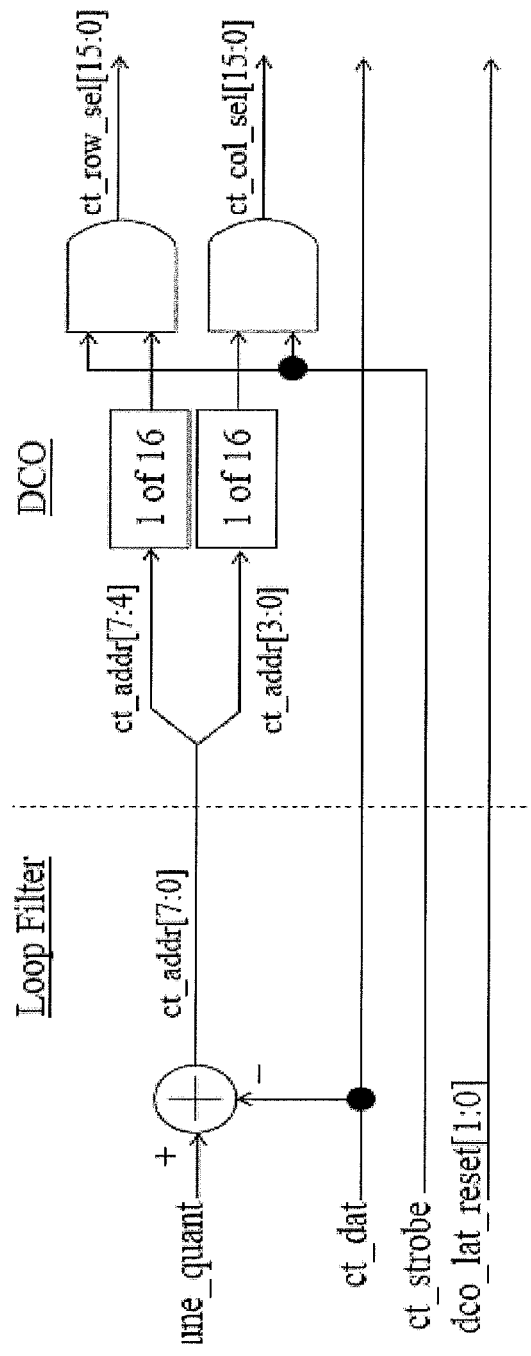
FIG. 18 is a circuit and timing diagram according to the exemplary embodiment of the present invention described in FIG. 12.

FIG. 16 provides a high-level picture of the coarse tune varactor array. FIG. 17 shows the implementation of the unit varactor elements that sit at the intersection of each horizontal and vertical line in FIG. 16. FIG. 18 shows the logic which generates ct_row_sel and ct_col_sel, where only one element from each array can be HIGH on ct_strobe.

According to an exemplary embodiment, the frequency-locked loop (not shown) resets the coarse tune varactor array to the midrange code of 128, where the top 8 rows are switched out of the tank, and the bottom 8 rows are switched into the tank. Separate logic that is not shown is driven by dco_lat_reset[1:01] to implement this logic function. Word coarse_tune_quant=accreg3[19:12] is also set to 128 as its value determines the number of unit varactors that are in their minimum capacitance state. Switching an element out of the tank means writing a '1' to the latch that drives that particular varactor. As coarse_tune_quant is increased, more elements are switched out of the tank.

FIG. 17 provides a conceptual block diagram of the latch 60 and varactor in the coarse tune array. A logic LOW on the Q output of the latch 60 pulls the drain and source of an NMOS device to GND leading to maximum gate capacitance. Ct_row_sel, ct_col_sel and ct_bit should all settle at which point the latch 60 can be written by pulling ct_strobe HIGH and then LOW. The storage element at the intersection of row and column lines is a latch, not a master-slave flip flop. Consequently, there is a transparent path from D to Q while the EN pin is HIGH.

The value of coarse_tune_quant determines how many elements in the varactor array are off. Only one element in the array is written when there is a change to the value of coarse_tune_quant. Ct_dat indicates whether the DCO 40 frequency should increase or decrease. The bit in the array that is addressed by the direct decoding of coarse_tune_quant into a row and column should be L, while the bits at array positions below (coarse_tune_quant−1) should be H. When coarse_tune_quant decreases by 1, the value of ct_dat is set L. The bit in position coarse_tune_quant should be L, so ct_addr is set equal to coarse_tune_quant when the frequency of the DCO 40 decreases. When coarse_tune_quant increases by 1, the bit position addressed by coarse_tune_quant−1 which was previously L is written H. Hence, ct_dat is subtracted from the LSB of coarse_tune_quant. A hardwired reset is being implemented within the DCO 40. When dco_lat_reset [1:0] is asserted 2, all of the latches in the top 8 rows are written with 1's, while all of the latches in the bottom 8 rows are written with 0's.

Finally, the interaction between the DLL and PLL, where the zero formed by the DLL and PLL is the jitter transfer bandwidth of the loop, will be described with reference to FIG. 3. Non-zero phase errors may arrive every N samples. All samples in-between are 0. There is a zero-order hold in the DLL path that takes the phase error and holds it for (N-1) samples. This ZOH has a gain of N at frequencies around dc. In this example the clock rate is on the order of 700 MHz, and the transfer bandwidth is around 1 MHz, the gain at 1 MHz is reasonably approximated as the gain at dc which is N.

N is 1 for both the half-rate and full-rate cases, which results in the same transfer bandwidth for 10 Gbps and 5 Gbps data. N is 2 for 2.5 Gbps and N doubles for every octave decrease in the data rate.

Acc2 35, a 13-bit accumulator that saturates at 0 and 8191 resides in the PLL path. Quantizing from 13-bits to 5-bits in the PLL path means the DCO 40 takes a PPMSTEP for each LSB change; PPMSTEP ranges from 100 to 200 and depends up whether a core of the DCO 40's is operating at the high or low frequency end of its range. Its average step size is 135 PPM.

The 13->5 bit quantization in the PLL path occurs in 2-steps. In the first step of quantization, the 3 LSBs from the Acc2 35 are dropped. The remaining 10 bits are quantized to 5 bits using noise shaping or delta-sigma modulation. By appropriately bounding the input of the noise-shaping coder in the PLL, the output of the quantization is restricted from going lower than 0 or higher than 31.

Acc1 37 is a 9-bit (wrapping) accumulator that resides in the DLL path. Acc1 37 yields infinite phase shift on the clock. A phase error of 1 causes DLLSLEW to be added to the accumulated value of Acc1 37 in the DLL path. A phase error of 1 causes DLLSLEW*BW to be added to the accumulated value of Acc2 35 in the PLL path. BW is a 3-bit positive integer that is used to manually scale the jitter transfer bandwidth. BW's nominal value of 5 is optimized for a fine varactor PPM step size of 135. BW can be used to compensate for step size variations in the DCO (e.g., at the high-end of the VCO core, the PPM step size could be 200 PPM. Therefore, BW can be set to a value such as 3 to realize a lower jitter transfer bandwidth.

The PLL path gain is:

$$PLL(s) = 2\pi \cdot \frac{DLLSLEW \cdot BW}{1-z^{-1}} \cdot \frac{2^5}{2^{13}} \cdot \frac{PPMSTEP \times F_o}{1,000,000} \cdot \frac{1}{2} \cdot \frac{1}{s} \quad \text{(Equation 14)}$$

The DLL path gain is:

$$DLL(s) = N \cdot \frac{DLLSLEW}{1-z^{-1}} \cdot \frac{2^6}{2^9} \cdot \frac{2\pi}{64} \quad \text{(Equation 15)}$$

The closed-loop pole of the system in radians/sec is determined by finding the root for s of PLL(s)+DLL(s)=0.

$$s + \frac{BW \times PPMSTEP \times F_o}{1,000,000} = 0 \quad \text{(Equation 16)}$$

The resulting closed-loop pole with BW=5, PPMSTEP=135, and Fo=10 GHz is at 6.4 Mrad/sec, which is a 3 dB jitter transfer bandwidth of 1.07 MHz.

The foregoing description is meant only to be exemplary. The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

The invention claimed is:

1. A continuous-rate clock and data recovery circuit, the circuit comprising:
   a delay locked loop with a phase shifter, wherein the delay locked loop comprises a first digital integrator;
   a phase locked loop with a digitally tunable oscillator, wherein the phase locked loop comprises a second digital integrator; and
   a phase detector,
   wherein the delay locked loop with the phase shifter and the phase locked loop with the digitally tunable oscillator are in a dual loop architecture, and
   wherein the phase detector is configured to control the first and second digital integrators.

2. The continuous-rate clock and data recovery circuit according to claim 1, wherein the phase detector comprises a binary phase detector.

3. The continuous-rate clock and data recovery circuit according to claim 2, wherein the binary phase detector is configured to detect phase errors only on rising data transitions, only on falling data transitions, or on both rising and falling data transitions.

4. The continuous-rate clock and data recovery circuit according to claim 1, further comprising a down sampler.

5. The continuous-rate clock and data recovery circuit according to claim 1, wherein the delay locked loop adjusts a phase of a signal adjusted by the phase locked loop.

6. The continuous-rate clock and data recovery circuit according to claim 1, wherein the first digital integrator comprises a wrapping accumulator, and wherein the second digital integrator is configured to saturate at a minimum value and at a maximum value.

7. The continuous-rate clock and data recovery circuit according to claim 1, further comprising a digital FIFO (first-in-first-out).

8. The continuous-rate clock and data recovery circuit according to claim 7, further comprising a serializer that transmits a down-sampled tuned clock signal to the digital FIFO.

9. A continuous-rate clock and data recovery circuit, the circuit comprising:
   a delay locked loop with an infinite phase shifter; and
   a phase locked loop with a digitally tunable oscillator,
   wherein the delay locked loop with the infinite phase shifter and the phase locked loop with the digitally tunable oscillator are in a dual loop architecture, the delay locked loop with the infinite phase shifter comprising a digital accumulator and a bits-to-phase interpolator.

10. The continuous-rate clock and data recovery circuit according to claim 9, the bits-to-phase interpolator comprising a bits-to-phase encoder and a phase interpolator.

11. The continuous-rate clock and data recovery circuit according to claim 10, the phase interpolator comprising a sine interpolator and a cosine interpolator.

12. The continuous-rate clock and data recovery circuit according to claim 9, wherein a value of the digital accumulator wraps upon exceeding a minimum or maximum value.

13. The continuous-rate clock and data recovery circuit according to claim 9, wherein the bits-to-phase interpolator generates a phase offset of a clock signal based on value of the digital accumulator and a look-ahead value.

14. A continuous-rate clock and data recovery circuit, the circuit comprising:
a delay locked loop with an infinite phase shifter; and
a phase locked loop with a digitally tunable oscillator, the phase locked loop comprising a first digital accumulator and a second digital accumulator,
wherein the delay locked loop with the infinite phase shifter and the phase locked loop with the digitally tunable oscillator are in a dual loop architecture,
wherein the first digital accumulator saturates at a minimum and at a maximum value.

15. A continuous-rate clock and data recovery circuit, the circuit comprising:
a delay locked loop with an infinite phase shifter; and
a phase locked loop with a digitally tunable oscillator, the phase locked loop comprising a first digital accumulator and a second digital accumulator,
wherein the delay locked loop with the infinite phase shifter and the phase locked loop with the digitally tunable oscillator are in a dual loop architecture,
wherein the second digital accumulator compensates for center frequency drift of the digitally tuned oscillator.

16. The continuous-rate clock and data-recovery circuit according to claim 15,
wherein the second digital accumulator saturates at a minimum and a maximum value.

17. A continuous-rate clock and data recovery circuit, the circuit comprising:
a delay locked loop with an infinite phase shifter; and
a phase locked loop with a digitally tunable oscillator, the phase locked loop comprising a first digital accumulator and a second digital accumulator,
wherein the delay locked loop with the infinite phase shifter and the phase locked loop with the digitally tunable oscillator are in a dual loop architecture,
wherein the second accumulator adjusts the digitally tuned oscillator so that the first digital accumulator locks at a mid-value.

18. A continuous-rate clock and data recovery circuit, the circuit comprising:
a delay locked loop with an infinite phase shifter; and
a phase locked loop with a digitally tunable oscillator, the phase locked loop comprising a first digital accumulator and a second digital accumulator,
wherein the delay locked loop with the infinite phase shifter and the phase locked loop with the digitally tunable oscillator are in a dual loop architecture,
wherein a jitter transfer bandwidth of the first digital accumulator is programmable.

19. A continuous-rate clock and data recovery circuit, the circuit comprising:
a delay locked loop with an infinite phase shifter;
a phase locked loop with a digitally tunable oscillator; and
a binary phase detector,
wherein the delay locked loop with the infinite phase shifter and the phase locked loop with the digitally tunable oscillator are in a dual loop architecture,
the delay locked loop comprising a first digital accumulator, the phase lock loop comprising a second digital accumulator, wherein the first digital accumulator is clocked at a rate N times a rate at which the second digital accumulator is clocked and N times a rate at which an output of the binary phase detector changes.

20. The continuous-rate clock and data recovery circuit according to claim 19, wherein the output of the binary phase detector is input to the first digital accumulator and input to the second digital accumulator.

21. The continuous-rate clock and data recovery circuit according to claim 20, wherein a value of the first accumulator is adjusted based on the output of the binary phase detector, and a value of the second accumulator is adjusted based on the output of the binary phase detector.

22. A method for generating a continuous-rate clock, the method comprising:
receiving a clock signal at a delay lock loop and phase lock loop;
in the delay lock loop, adjusting the clock signal by increasing a phase offset of the clock signal based on a value of a first digital accumulator and a look-ahead value;
in the phase lock loop, adjusting control logic of a source of the clock signal based on a value of a second digital accumulator; and
adjusting control logic of the source of the clock signal such that the value of the second digital accumulator locks on a mid-value.

23. A method for generating a continuous-rate clock, the method comprising:
receiving a clock signal at a delay lock loop and phase lock loop;
in the delay lock loop, adjusting the clock signal by increasing a phase offset of the clock signal based on a value of a first digital accumulator and a look-ahead value;
in the phase lock loop, adjusting control logic of a source of the clock signal based on a value of a second digital accumulator; and
cleaning jitter from a recovered clock signal by absorbing timing difference between the clock signal and an adjusted clock signal.

24. The method for generating the continuous-rate clock signal according to claim 23, wherein the clock signal and the adjusted clock signal are both down-sampled.

* * * * *